United States Patent
Nakamura

(10) Patent No.: US 12,278,084 B2
(45) Date of Patent: Apr. 15, 2025

(54) ELECTRON MICROSCOPE AND IMAGE GENERATION METHOD

(71) Applicant: JEOL Ltd., Tokyo (JP)

(72) Inventor: Motohiro Nakamura, Tokyo (JP)

(73) Assignee: JEOL Ltd., Tokyo (JP)

( * ) Notice: Subject to any disclaimer, the term of this patent is extended or adjusted under 35 U.S.C. 154(b) by 441 days.

(21) Appl. No.: 17/858,436

(22) Filed: Jul. 6, 2022

(65) Prior Publication Data

US 2023/0015400 A1    Jan. 19, 2023

(30) Foreign Application Priority Data

Jul. 7, 2021   (JP) .................. 2021-112609

(51) Int. Cl.
  *H01J 37/22*   (2006.01)
  *H01J 37/21*   (2006.01)
  *H01J 37/28*   (2006.01)

(52) U.S. Cl.
  CPC ........... *H01J 37/222* (2013.01); *H01J 37/21* (2013.01); *H01J 37/28* (2013.01); *H01J 2237/221* (2013.01); *H01J 2237/24578* (2013.01); *H01J 2237/2814* (2013.01)

(58) Field of Classification Search
  CPC .......... H01J 37/222; H01J 37/21; H01J 37/28; H01J 2237/221; H01J 2237/24578; H01J 2237/2814
  See application file for complete search history.

(56) References Cited

U.S. PATENT DOCUMENTS

| 5,656,812 A | 8/1997 | Takahashi |
| 7,075,077 B2 | 7/2006 | Okuda et al. |
| 2016/0035538 A1* | 2/2016 | Fukuda ................... H01L 22/12 250/307 |

FOREIGN PATENT DOCUMENTS

JP    3270687 B2    1/2002

OTHER PUBLICATIONS

Extended European Search Report issued in EP22181107.8 on Dec. 16, 2022.

* cited by examiner

*Primary Examiner* — Nicole M Ippolito
*Assistant Examiner* — Hanway Chang
(74) *Attorney, Agent, or Firm* — The Webb Law Firm

(57) ABSTRACT

Provided is an electron microscope for generating a montage image by acquiring images of a plurality of regions in a montage image capturing region set on a specimen, and by connecting the acquired images. The electron microscope includes a specimen surface height calculating unit that calculates a distribution of specimen surface heights in the montage image capturing region by performing curved surface approximation based on the specimen surface heights determined by performing focus adjustment at a plurality of points set in a region including the montage image capturing region, and an image acquiring unit that acquires the images of the plurality of regions based on the calculated distribution of the specimen surface heights.

4 Claims, 3 Drawing Sheets

ELECTRON MICROSCOPE AND IMAGE GENERATION METHOD

CROSS REFERENCE TO RELATED APPLICATION

The application claims priority to Japanese Patent Application No. 2021-112609, filed Jul. 7, 2021, the disclosure of which is hereby incorporated by reference in its entirety.

BACKGROUND OF THE INVENTION

Field of the Invention

The present invention relates to an electron microscope and an image generation method.

Description of Related Art

In electron microscopes, a method of acquiring (capturing) images of a plurality of regions while changing the field-of-view by driving a deflector or a stage and acquiring a montage image (montage image capturing) by connecting the plurality of acquired images is known. If auto focus adjustment (auto focus) is executed every time when each of the images of a plurality of regions is acquired, it takes a long time to capture the montage image. Japanese Patent No. 3270687 is related to a technique of creating a focus map, and discloses a method for equally dividing a specimen surface, and using the focus map for each of planes resulting from the division.

In the above prior art, however, since the Z coordinate is measured in the focus adjustment at each of the 25 measurement points, a number of focus measurement points may become too many depending on the size of the measurement region.

SUMMARY OF THE INVENTION

The invention can provide an electronic microscope and an image generation method by which time required for montage image capturing can be shortened.

According to a first aspect of the invention, there is provided an electron microscope for generating a montage image by acquiring images of a plurality of regions in a montage image capturing region set on a specimen, and by connecting the acquired images, the electron microscope including:
  a specimen surface height calculating unit that calculates a distribution of specimen surface heights in the montage image capturing region by performing curved surface approximation based on the specimen surface heights determined by performing focus adjustment at a plurality of points set in a region including the montage image capturing region; and
  an image acquiring unit that acquires the images of the plurality of regions based on the calculated distribution of the specimen surface heights.

According to a second aspect of the invention, there is provided an image generation method for generating a montage image by acquiring images of a plurality of regions in a montage image capturing region set on a specimen, and by connecting the acquired images, the method including:
  a specimen surface height calculating step of calculating a distribution of specimen surface heights in the montage image capturing region by performing curved surface approximation based on the specimen surface heights determined by performing focus adjustment at a plurality of points set in a region including the montage image capturing region; and
  an image acquiring step of acquiring the images of the plurality of regions based on the calculated distribution of the specimen surface heights.

BRIEF DESCRIPTION OF THE OF THE DRAWINGS

Figure 1:
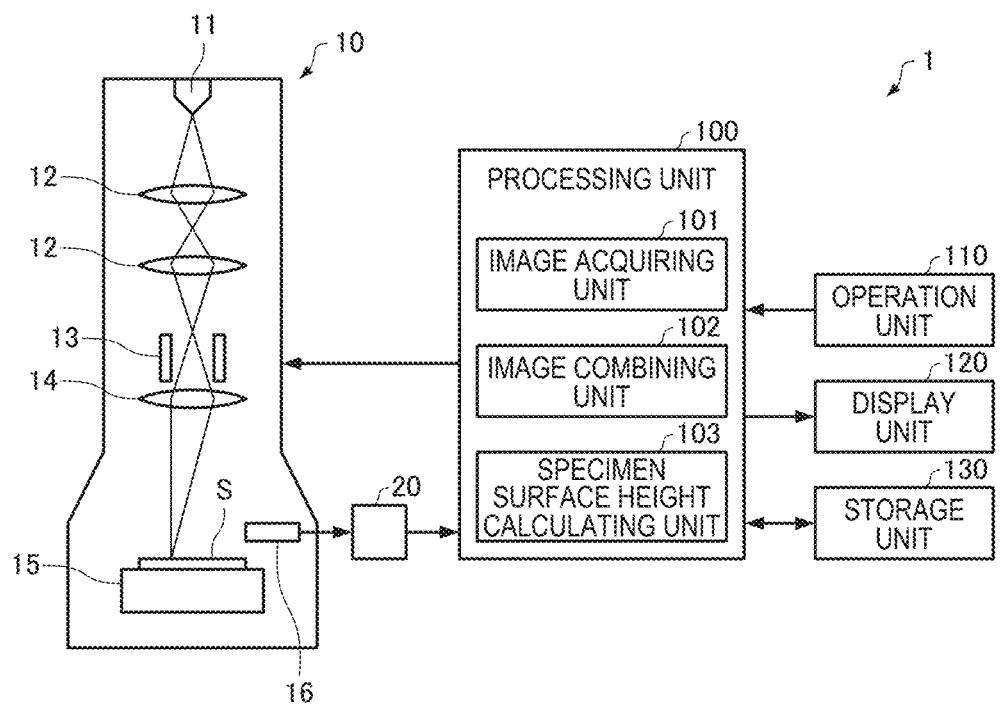
FIG. 1 is a schematic diagram illustrating an example of a configuration of an electron microscope according to an embodiment of the invention.

DESCRIPTION OF THE INVENTION (1) According to an embodiment of the invention, there is provided an electron microscope for generating a montage image by acquiring images of a plurality of regions in a montage image capturing region set on a specimen, and by connecting the acquired images, the electron microscope including:
  a specimen surface height calculating unit that calculates a distribution of specimen surface heights in the montage image capturing region by performing curved surface approximation based on the specimen surface heights determined by performing focus adjustment at a plurality of points set in a region including the montage image capturing region; and
  an image acquiring unit that acquires the images of the plurality of regions based on the calculated distribution of the specimen surface heights.

According to an embodiment of the invention, there is provided an image generation method for generating a montage image by acquiring images of a plurality of regions in a montage image capturing region set on a specimen, and by connecting the acquired images, the method including:
  a specimen surface height calculating step of calculating a distribution of specimen surface heights in the montage image capturing region by performing curved surface approximation based on the specimen surface heights determined by performing focus adjustment at a plurality of points set in a region including the montage image capturing region; and
  an image acquiring step of acquiring the images of the plurality of regions based on the calculated distribution of the specimen surface heights.

According to the above embodiment, focus adjustment is performed at each position of a plurality of points which are set in a region including the montage image capturing region, and curved surface approximation is performed based on a specimen surface height determined at each position, whereby a distribution of the specimen surface heights (focus map) in the montage image capturing region is calculated and the images of the plurality of regions are acquired based on the calculated distribution of the specimen surface heights. Therefore it is unnecessary to execute the auto focus adjustment every time when each of the images of the plurality of regions is acquired, hence time required for the montage image capturing can be shortened.

(2) In the above mentioned electron microscope, the specimen surface height calculating unit may approximate the montage image capturing region to a rectangle, respectively set four points among the plurality of points to positions near vertices of the rectangle, and respectively set two points among the plurality of points to positions near mid-points of long sides of the rectangle.

In the above image generation method, the specimen surface height calculating step may approximate the montage image capturing region to a rectangle, may respectively set four points among the plurality of points to positions near vertices of the rectangle, and may respectively set two points among the plurality of points to positions near mid-points of long sides of the rectangle.

According to the above embodiments, if focus adjustment is performed at the position of six points on the montage image capturing region, it is no longer necessary to execute the auto focus adjustment every time when each of the images of the plurality of regions is acquired, hence time required for the montage image capturing can be shortened.

(3) In the above mentioned electron microscope, in a case where a user has selected a first mode, the image acquiring unit may receive an input from the user to specify a region at which auto focus adjustment is to be executed, from the plurality of regions, and execute the auto focus adjustment at the specified region when acquiring an image of the specified region, and in a case where the user has selected a second mode, the image acquiring unit may acquire the images of the plurality of regions based on the distribution of the specimen surface heights calculated by the specimen surface height calculating unit.

In the above image generation method, in a case where a user has selected a first mode, the image acquiring step may receive an input from the user to specify a region at which auto focus adjustment is to be executed, from the plurality of regions, and execute the auto focus adjustment at the specified region when acquiring an image of the specified region, and in a case where the user has selected a second mode, the image acquiring step may acquire the images of the plurality of regions based on the distribution of the specimen surface heights calculated by the specimen surface height calculating unit.

According to the above embodiment, the auto focus adjustment is executed only when an image of the region specified by the user is acquired in the first mode, hence a number of times of executing the auto focus adjustment can be minimized, and the time required for the montage image capturing can be shortened. Further, according to the above embodiment, the user can select the first mode, in which whether the auto focus adjustment is executed or not is specified for each region, or the second mode, in which images of the plurality of regions are acquired using the focus map, hence user-friendliness can be improved.

Preferred embodiments of the invention are described in detail below with reference to the drawings. It is noted that the following embodiments do not unduly limit the scope of the invention as stated in the claims. In addition, all of the components described below are not necessarily essential requirements of the invention.

1. Configuration

FIG. 1 is a schematic diagram illustrating an example of a configuration of the electron microscope according to an embodiment of the invention. Whereas a case where the electron microscope has a configuration of a scanning electron microscope (SEM) will be described here, the electron microscope according to the invention may have a configuration of a transmission electron microscope (TEM), or a configuration of a scanning transmission electron microscope (STEM). The electron microscope of the present embodiment may have a configuration where a part of the composing elements (component) in FIG. 1 is omitted.

The electron microscope 1 includes an electron microscope main unit 10, a processing unit 100, an operation unit 110, a display unit 120 and a storage unit 130.

The electron microscope main unit 10 includes an electron source 11, a focusing lens 12, a deflector 13, an objective lens 14, a specimen stage 15 and an electron detector 16.

The electron source 11 generates an electron beam. The electron source 11 is an electron gun that accelerates electrons emitted from a cathode by an anode, and thereby emits the electron beam.

The focusing lens 12 (condenser lens) is a lens for focusing the electron beam emitted from the electron source 11, and forming an electron probe. The diameter of the electron probe (electron beam diameter) and a probe current (illumination current amount) can be controlled using the focusing lens 12. The objective lens 14 is a lens disposed directly before the specimen S, and is used for forming the electron probe. The objective lens 14 is an electromagnetic lens, and includes an electromagnetic coil.

The deflector 13 (scanning coil) deflects the electron probe (electron beam) formed by the focusing lens 12 and the objective lens 14. The deflector 13 is used to scan the surface of the specimen S with the electron probe. The deflector 13 is also used for moving the electron probe to an arbitrary position on the specimen S, and irradiating this position with the electron probe.

The specimen stage 15 holds the specimen S and moves the specimen S in the horizontal direction and the vertical direction, or rotates the specimen S around the vertical axis. The specimen stage 15 includes a driving mechanism to move and rotate the specimen S.

The electron detector 16 detects secondary electrons and backscattered electrons which are emitted from the specimen S when the specimen S is irradiated (scanned) with the electron probe. An output signal of the electron detector 16 (intensity signal of secondary electrons or backscattered electrons) is amplified by an amplifier 20 and supplied to the processing unit 100.

The operation unit 110 is for the user to input operation information, and outputs the inputted operation information to the processing unit 100. The functions of the operation unit 110 are implemented by such hardware as a keyboard, a mouse, buttons, a touch panel, and a touch pad.

The display unit 120 is for outputting an image generated by the processing unit 100 (e.g. electron microscope image, montage image), and the functions of the display unit 120 can be implemented by a touch panel, which also functions as the operation unit 110, an LCD, a CRT, or the like.

The storage unit 130 stores programs and various data to cause the computer to function as each component of the processing unit 100, and also functions as a work area of the processing unit 100. The functions of the storage unit 130 can be implemented by a hard disk, RAM, or the like.

The processing unit 100 performs processing to control the electron microscope main unit 10 (electron source 11, focusing lens 12, deflector 13, objective lens 14 and specimen stage 15), processing to acquire a scanning electron microscope image of the specimen S by imaging the detection signals amplified by the amplifier 20 synchronizing with the scanning signals, display control, and the like. The functions of the processing unit 100 can be implemented by such hard ware as various processors (e.g. CPU, DSP) and programs. The processing unit 100 includes an image acquiring unit 101, an image combining unit 102 and the specimen surface height calculating unit 103.

The image acquiring unit 101 sets a plurality of regions in the montage image capturing region that is set on the specimen S, so that the regions partially overlap with each other, and acquires the electron microscope images while changing the field-of-view by the control of moving the specimen stage 15, whereby images of the plurality of regions in the montage image capturing region are acquired.

The image combining unit 102 generates a montage image (combined image) by connecting the images acquired by the image acquiring unit 101 with correcting the position of each image. The position of each image can be corrected by performing the image matching at the portion where images overlap (overlapped region) using the cross correlation method, for example.

In the present embodiment, a first mode and a second mode are provided as the montage image capturing modes. In the case where the user selected the first mode, the image acquiring unit 101 accepts the input from the user to specify a target region to execute the auto focus adjustment from a plurality of regions in the montage image capturing region. Then the image acquiring unit 101 executes the auto focus adjustment (auto focus) when an image of the region specified by the user is acquired, and does not execute the auto focus adjustment when an image of a region not specified by the user is acquired.

In the case where the user selected the second mode, the specimen surface height calculating unit 103 performs focus adjustment at each position of a plurality of points (at least five points, preferably at least six points) which are set in the montage image capturing region, and performs curved surface approximation based on the specimen surface height determined at each position. Then the specimen surface height calculating unit 103 calculates a distribution of the specimen surface heights (specimen surface height in each of the plurality of regions) in the montage image capturing region. Based on the distribution of the specimen surface heights calculated by the specimen surface height calculating unit 103, the image acquiring unit 101 acquires the images of the plurality of regions by controlling the excitation amount of the objective lens 14 or the heights of the specimen stage 15 at the time of acquiring an image of each region.

2. Method of Present Embodiment

The method according to the present embodiment will be described with reference to the drawings.

The user can specify the position and the size of the montage image capturing region on a display screen, where an electron microscope image captured at a low magnification is displayed, and based on this specified information, the montage image capturing region is set on the electron microscope image (on the stage coordinates). For example, a rectangle (square), of which vertices at opposite angles are the two points specified by the user, is set as the montage image capturing region. Once the montage image capturing region is set, a plurality of regions are automatically set in the montage image capturing region, so that the regions partially overlap with each other, based on the magnification used for capturing the montage image, required resolution, and the like. In the case of the example in FIG. 2, a total of 30 regions AR are set in the montage image capturing region MA (five regions in the X axis direction (horizontal direction), and six regions in the Y direction (vertical direction)), and are displayed on the display screen such that a contour of each region AR can be identified. When a montage image is captured, each region AR becomes one field-of-view, and the image of each region AR can be captured and acquired at high magnification.

Figure 2:
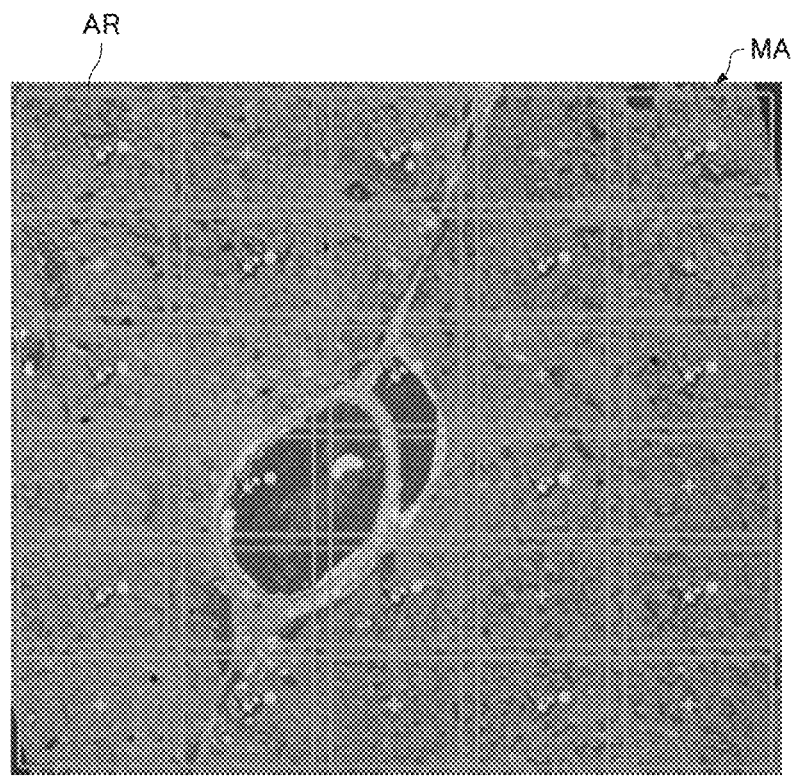
FIG. 2 illustrates an example of a montage image capturing region.

In the case where the user selected the first mode here as the montage image capturing mode, the user can set (specify) whether auto focus adjustment is executed for each region AR or not, on the display screen illustrated in FIG. 2 (screen where the electron microscope image, the montage image capturing region MA and a plurality of regions AR are displayed). For a region AR specified as a target region to execute the auto focus adjustment, "ON" is set as an execution flag, and this information is displayed linking with this region AR. Not only does the user individually specify a target region AR to execute the auto focus adjustment, but the user may also be able to specify the cycle of executing the auto focus adjustment, such as executing the auto focus adjustment every three fields-of-view. Further, auto focus adjustment may be executed when the specimen stage 15 moved at least for the distance specified by the user, when the field-of-view is changed. The auto focus adjustment is normally performed at the center position of the region AR, that is set as a target region to execute the auto focus adjustment, but the user may be able to specify (change) the positions at which the auto focus adjustment is executed within this region AR. Thereby in a case where a foreign substance having low contrast exists at the center of the target region AR to execute the auto focus adjustment, the user can shift the target position to execute the auto focus adjustment from the center of this region AR, and whereby failure of the auto focus adjustment can be prevented.

Figure 3:
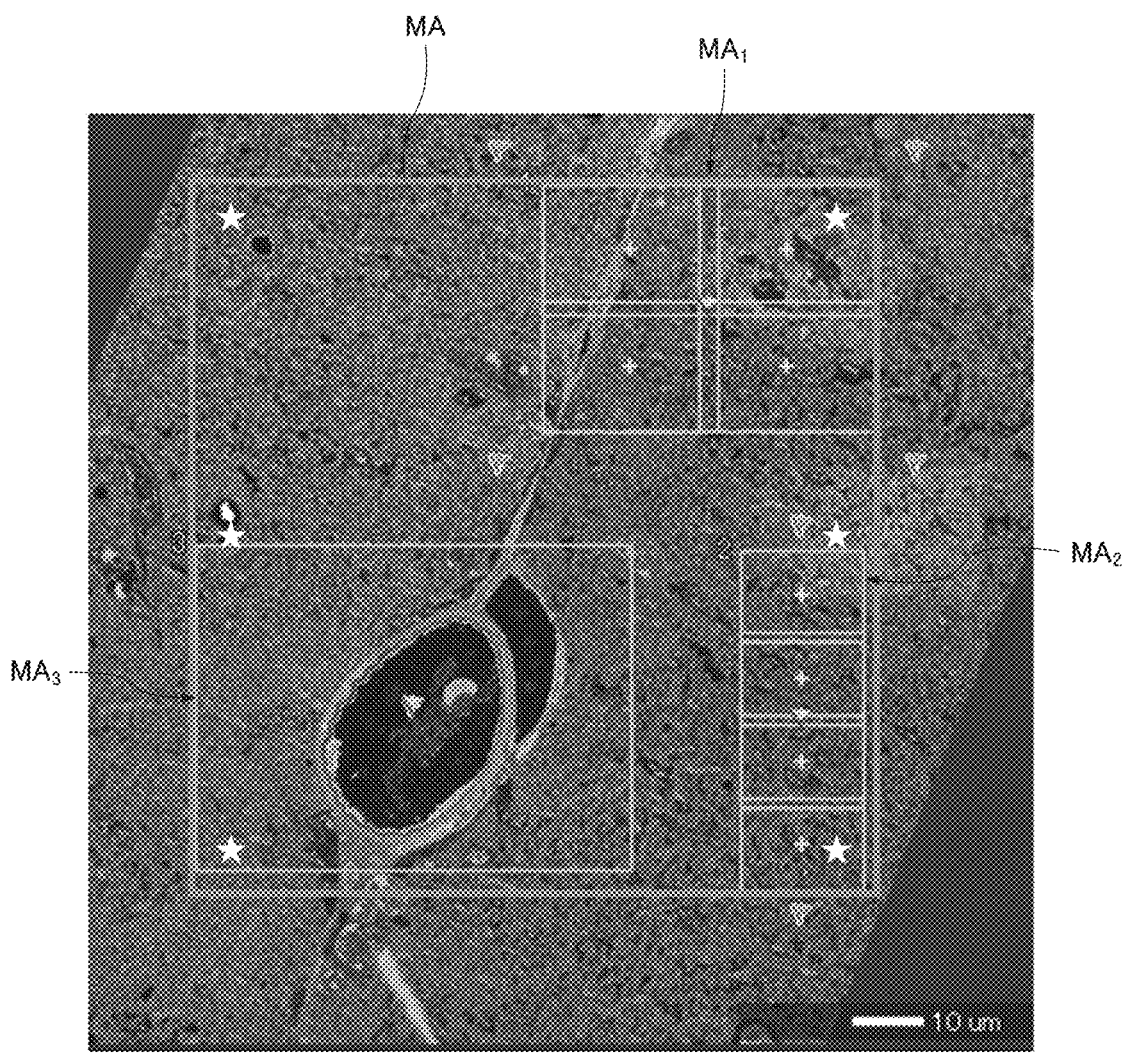
FIG. 3 illustrates an example of a montage image capturing region.

In the case where the user selected the second mode as the montage image capturing mode, a focus map (distribution of specimen surface heights) is created for the montage image capturing region MA. Specifically, a plurality of target positions (focus measurement points) to execute the auto focus adjustment are automatically set in regions that include the montage image capturing region MA. In the example in FIG. 3, the montage image capturing region is separated into two or more regions ($MA_1$ which includes four regions AR, $MA_2$ which includes four regions AR, and $MA_3$ which includes one region AR), hence the montage image capturing region MA is approximated by a rectangle which includes these regions ($MA_1$, $MA_2$ and $MA_3$). Then as illustrated in FIG. 3, four points among the plurality of focus measurement points (six points indicated by stars), are set near the vertices of the rectangle, and the other two points are set near the mid-point of the long sides of the rectangle. In the case where the montage image capturing region MA is a square, the side in the X axis direction (or the Y axis direction) is regarded as the long side of the rectangle. In the example in FIG. 3, the focus measurement points are set at points near the vertices of the rectangle and as mid-points of the long sides located on the inner side of the rectangle, but the focus measurement points may be set directly on the vertices and mid-points, or may be set at points near the vertices and mid-points located on the outer side of the rectangle. In the case of setting the focus measurement points at points that shifted from the vertices and mid-points to the inner side or outer side of the rectangle, the focus measurement points may be set at positions that are distant from the vertices and mid-points by fixed distances in the X axis direction and the Y axis direction (e.g. 10 μm in the X axis direction, and 10 μm in the Y axis direction), or may be set at positions that are distant from the vertices and mid-points by a distance determined by the length of one side of the rectangle (e.g., ¼ of the length of one side of the rectangle). The user may be allowed to freely change the focus measurement points that are automatically set near the vertices of the rectangle and mid-points of the long sides.

When focus measurement points are set, focus adjustment (auto focus adjustment or manual focus adjustment) is performed at the plurality of focus measurement points that are set, and the specimen surface height (z) at each focus measurement point is determined based on the excitation amount of the objective lens 14 or the height of the specimen stage 15 when each focus measurement point is in focus. Based on the stage coordinates (x, y) and the specimen surface height (z) at each focus measurement point, the coordinates (x, y, z) of each focus measurement point are determined. Then curved surface approximation is performed based on the determined coordinates (x, y, z) of the plurality of focus measurement points, and distribution of the specimen surface heights in the montage image capturing region MA is calculated. The expression of the curved approximation is a polynomial having two variables (x, y), and in the case of a quadratic surface, the specimen surface height (z) at the stage coordinates (x, y), that is, the distribution of the specimen surface heights z (x, y), is given by the following Expression (1).

$$z(x,y)=ax^2+bxy+cy^2+dx+ey+f \quad (1)$$

Coefficients a to f of Expression (1) can be determined based on the coordinates (x, y, z) measured at the plurality of focus measurement points using the least squares method. In the case of acquiring images of a plurality of regions AR in the second mode, auto focus adjustment is not executed, but stage coordinates (x, y) of an acquisition target region AR are substituted in Expression (1), and the specimen surface height (z) of this region AR is determined. Then based on the determined specimen surface height (z), the excitation amount of the objective lens 14 or the height of the specimen stage 15 is controlled, whereby focusing is performed. The specimen surface height (z) may be the specimen surface height itself, or may be information equivalent to the specimen surface height (excitation amount of the objective lens 14 or height of the specimen stage 15 in the focused state).

Thus according to the present embodiment, in the first mode, the auto focus adjustment is executed only when the image of a region AR specified by the user from a plurality of regions AR in the montage image capturing region MA, is acquired, hence a number of times of executing the auto focus adjustment can be minimized, and time required for the montage image capturing can be shortened. Further, according to the present embodiment, in the second mode, images of a plurality of regions AR are acquired using the focus map created for the montage image capturing region MA. Therefore it is unnecessary to execute the auto focus adjustment every time when each of the images of the plurality of regions AR is acquired, hence time required for montage image capturing can be shortened. Furthermore, according to the present embodiment, the curved surface approximation is performed for the specimen surface heights when the focus map is created in the second mode, thereby the accuracy of approximation can be improved compared with plane approximation. Moreover, by performing the curved surface approximation on the entire montage image capturing region MA in the second mode, a number of focus measurement points can be decreased compared with the prior art of dividing the image capturing region and performing plane approximation.

It may be configured such that the user can specify a target region AR to execute the auto focus adjustment in the second mode as well, and auto focus adjustment may be performed for exceptionally the region AR specified by the user when the images of the plurality of regions AR are acquired.

3. Processing

Figure 4:
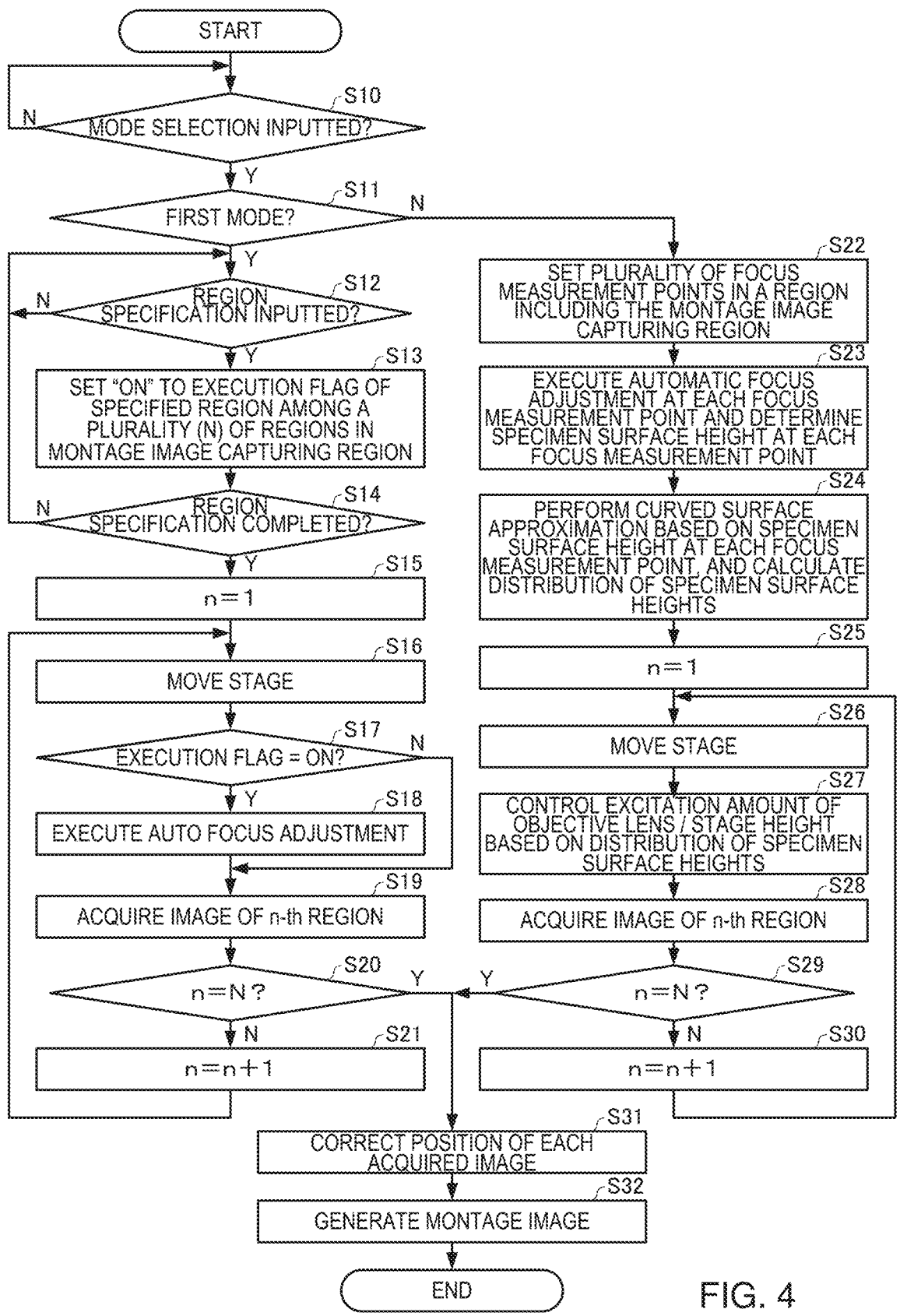
FIG. 4 is a flow chart illustrating a flow of processing by a processing unit.

FIG. 4 is a flow chart illustrating a flow of processing by the processing unit 100. Here it is assumed that the montage image capturing region MA and a plurality of (N number of) regions AR in the montage image capturing region MA have already been set.

The image acquiring unit 101 determines whether input (operation) to select the montage image capturing mode is received (step S10), and if this input is received (Y in step S10), the image acquiring unit 101 determines whether the first mode is selected (step S11).

If the first mode is selected (Y in step S11), the image acquiring unit 101 determines whether input to specify a target region AR to execute the auto focus adjustment, from the plurality of regions AR in the montage image capturing region MA, is received (step S12), and if this input is received (Y in step S12), the image acquiring unit 101 switches the execution flag of the specified region AR from "OFF" to "ON" (step S13). Then the image acquiring unit 101 determines whether the input to indicate completion of the specification of the region AR is received (step S14), and advances to step S12 if this input is not received (N in step S14).

If the input to indicate completion of the specification of the region AR is received (Y in step S14), the image acquiring unit 101 sets the variable n to 1 (step S15), and moves the specimen stage 15 to the field-of-view of the n-th region AR among the N number of region AR (step S16). Then the image acquiring unit 101 determines whether "ON" is set for the execution flag of the n-th region AR (step S17). If the execution flag is set to "ON" (Y in step S17), the image acquiring unit 101 executes the auto focus adjustment, and controls the excitation amount of the objective lens 14 and the height of the specimen stage 15 so that the region AR is focused (step S18). If the execution flag is set to "OFF" (N in step S17), the image acquiring unit 101 skips step S18, and maintains the current setting for the excitation amount of the objective lens 14 and the height of the specimen stage 15. Then the image acquiring unit 101 acquires the image of the n-th region AR (step S19), and determines whether the variable n reached N (step S20). If the variable n has not reached N (N in step S20), the image acquiring unit 101 adds 1 to the variable n (step S21), and advances to step S16.

If the second mode is selected (N in step S11), the specimen surface height calculating unit 103 sets a plurality of focus measurement points in regions that include the montage image capturing region MA (near the vertices of the montage image capturing region MA approximated to a rectangle, and near the mid-points of the long sides thereof) (step S22), executes the auto focus adjustment at each focus measurement point that are set, and determines the specimen surface height at each focus measurement point (step S23). Then based on the determined specimen surface height at each focus measurement point, the specimen surface height calculating unit 103 performs the curved surface approximation, and calculates the distribution of the specimen surface heights (coefficients a to f of Expression (1)) (step S24).

Then the image acquiring unit 101 sets the variable n to 1 (step S25), and moves the specimen stage 15 to the field-of-view of the n-th region AR among the N number of regions AR (step S26). Then the image acquiring unit 101 calculates the specimen surface height of the n-th region AR based on the stage coordinates of the n-th region AR and the distribution of the calculated specimen surface heights, and controls the excitation amount of the objective lens 14 and the height of the specimen stage 15 based on the calculated specimen surface height, so that the n-th region AR is focused (step S27). Then the image acquiring unit 101 acquires the image of the n-th region AR (step S28), and determines whether the variable n has reached N (step S29). If the variable n has not reached N (N in step S29), the image acquiring unit 101 adds 1 to the variable n (step S30), and advances to step S26.

If the variable n reached N (Y in step S20, Y in step S29), the image combining unit 102 corrects the position of each acquired image (images of the first to N-th regions AR) (step S31), and generates a montage image by connecting the N number of images of which positions have been corrected (step S32).

The invention is not limited to the above-described embodiments, and various modifications can be made. The invention includes configurations that are substantially the same (for example, in functions, methods, and results, or in objectives and effects) as the configurations described in the embodiments. The invention also includes configurations obtained by replacing non-essential elements of the configurations described in the embodiments with other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

The invention claimed is:

1. An electron microscope for generating a montage image by acquiring images of a plurality of regions in a montage image capturing region set on a specimen, and by connecting the acquired images, the electron microscope comprising:

a specimen surface height calculating unit that calculates a distribution of specimen surface heights in the montage image capturing region by performing curved surface approximation based on the specimen surface heights determined by performing focus adjustment at a plurality of points set in a region including the montage image capturing region; and an image acquiring unit that acquires the images of the plurality of regions based on the calculated distribution of the specimen surface heights, wherein the specimen surface heights are determined based on an excitation amount of an objective lens of the electron microscope or a height of a specimen stage of the electron microscope when each point of the plurality of points is in focus.

2. The electron microscope according to claim 1, wherein the specimen surface height calculating unit approximates the montage image capturing region to a rectangle, respectively sets four points among the plurality of points to positions near vertices of the rectangle, and respectively sets two points among the plurality of points to positions near mid-points of long sides of the rectangle.

3. The electron microscope according to claim 1, wherein in a case where a user has selected a first mode, the image acquiring unit receives an input from the user to specify a region at which auto focus adjustment is to be executed, from the plurality of regions, and executes the auto focus adjustment at the specified region when acquiring an image of the specified region, and in a case where the user has selected a second mode, the image acquiring unit acquires the images of the plurality of regions based on the distribution of the specimen surface heights calculated by the specimen surface heights calculating unit.

4. An image generation method for generating a montage image by acquiring images of a plurality of regions in a montage image capturing region set on a specimen and by connecting the acquired images, the method comprising:

a specimen surface height calculating step of calculating a distribution of specimen surface heights in the montage image capturing region by performing curved surface approximation based on the specimen surface heights determined by performing focus adjustment at a plurality of points set in a region including the montage image capturing region; and an image acquiring step of acquiring the images of the plurality of regions based on the calculated distribution of the specimen surface heights, wherein the specimen surface heights are determined based on an excitation amount of an objective lens of an electron microscope or a height of a specimen stage of the electron microscope when each point of the plurality of points is in focus.

* * * * *